(12) United States Patent
Shu

(10) Patent No.: US 8,411,437 B2
(45) Date of Patent: Apr. 2, 2013

(54) ELECTRONIC DEVICE HAVING FAN DUCT

(75) Inventor: Si-Wen Shu, Shenzhen (CN)

(73) Assignees: Hong Fu Jin Precision Industry (ShenZhen) Co., Ltd., Shenzhen (CN); Hon Hai Precision Industry Co., Ltd., New Taipei (CN)

( * ) Notice: Subject to any disclaimer, the term of this patent is extended or adjusted under 35 U.S.C. 154(b) by 252 days.

(21) Appl. No.: 12/975,290

(22) Filed: Dec. 21, 2010

(65) Prior Publication Data
US 2012/0127664 A1 May 24, 2012

(30) Foreign Application Priority Data
Nov. 22, 2010 (CN) .......................... 2010 1 0553765

(51) Int. Cl.
*H05K 7/20* (2006.01)
(52) U.S. Cl. ........................................ 361/695
(58) Field of Classification Search .................. None
See application file for complete search history.

(56) References Cited

U.S. PATENT DOCUMENTS

| | | | |
|---|---|---|---|
| 7,463,482 B2 * | 12/2008 | Chien et al. | 361/679.55 |
| 7,599,180 B2 * | 10/2009 | Ong et al. | 361/679.51 |
| 7,633,756 B2 * | 12/2009 | Xu | 361/700 |
| 7,742,296 B2 * | 6/2010 | Lai et al. | 361/679.5 |
| 7,983,038 B2 * | 7/2011 | Levesque et al. | 361/692 |
| 2003/0002254 A1 * | 1/2003 | Faneuf et al. | 361/687 |
| 2003/0188847 A1 * | 10/2003 | Lai et al. | 165/80.2 |
| 2004/0004812 A1 * | 1/2004 | Curlee et al. | 361/687 |
| 2004/0057210 A1 * | 3/2004 | Wilson et al. | 361/695 |
| 2004/0218359 A1 * | 11/2004 | Malone et al. | 361/695 |
| 2005/0041392 A1 * | 2/2005 | Chen | 361/695 |
| 2005/0174741 A1 * | 8/2005 | Sevakivi | 361/721 |
| 2005/0286223 A1 * | 12/2005 | Morales | 361/690 |
| 2006/0039110 A1 * | 2/2006 | Foster et al. | 361/697 |
| 2006/0120038 A1 * | 6/2006 | Lucero et al. | 361/694 |
| 2007/0008699 A1 * | 1/2007 | Strmiska et al. | 361/687 |
| 2007/0169920 A1 * | 7/2007 | Yang | 165/104.34 |
| 2008/0080143 A1 * | 4/2008 | Peng et al. | 361/719 |
| 2008/0083528 A1 * | 4/2008 | Chen et al. | 165/121 |
| 2008/0117590 A1 * | 5/2008 | Dey et al. | 361/687 |
| 2009/0059519 A1 * | 3/2009 | Ong et al. | 361/690 |
| 2009/0059524 A1 * | 3/2009 | Peng et al. | 361/697 |
| 2009/0129018 A1 * | 5/2009 | Zhou et al. | 361/697 |
| 2009/0166011 A1 * | 7/2009 | Xu | 165/121 |
| 2009/0168330 A1 * | 7/2009 | Li et al. | 361/679.47 |
| 2009/0244849 A1 * | 10/2009 | Min et al. | 361/710 |
| 2009/0279252 A1 * | 11/2009 | Musciano et al. | 361/692 |

* cited by examiner

*Primary Examiner* — Lisa Lea Edmonds
*Assistant Examiner* — Xanthia C Cunningham
(74) *Attorney, Agent, or Firm* — Altis Law Group, Inc

(57) ABSTRACT

An exemplary fan duct includes a top plate, two sidewalls and a baffle. The sidewalls extend from opposite ends of the top plate. The baffle engages with the top plate and is located between the two sidewalls. The baffle includes a first end and a second end opposite to the first end, the first end pivotably engages with the top plate, and the baffle rotates about the first end to make the second end engage with the top plate or one of the sidewalls.

20 Claims, 7 Drawing Sheets

ELECTRONIC DEVICE HAVING FAN DUCT

BACKGROUND

1. Technical Field

The present disclosure relates to heat dissipation, and more particularly to an electronic device having a fan duct for guiding airflow to cool electronic components of the electronic device.

2. Description of Related Art

As electronic devices such as computers continue to develop, some personal computers have more than one central processing unit (CPU) mounted on a motherboard of the computer. The CPUs generate a large amount of heat when they operate, and the computer needs a heat dissipation device to cool the CPUs.

A typical heat dissipation device includes a fan, which is mounted on a fan duct. The fan duct guides airflow generated by the fan to flow over the CPUs. The fan duct includes an air inlet and an air outlet opposite to the air inlet. The fan is mounted on the air inlet. The fan duct is secured on the motherboard of the computer, and the air outlet of the fan duct spans the CPUs when the CPUs are mounted on the motherboard. Airflow generated by the fan flows through the fan duct and cools all of the CPUs. However, when one (or more) of the CPUs has been removed from the motherboard, a great quantity of air may flow through the fan duct to a part of the motherboard where no CPU is located. Thus, such airflow is liable to be completely wasted. The other CPUs on the motherboard are not efficiently cooled by the airflow in the fan duct.

It is desirable to provide an electronic device having means which can overcome the described limitations.

DETAILED DESCRIPTION

Figure 1:
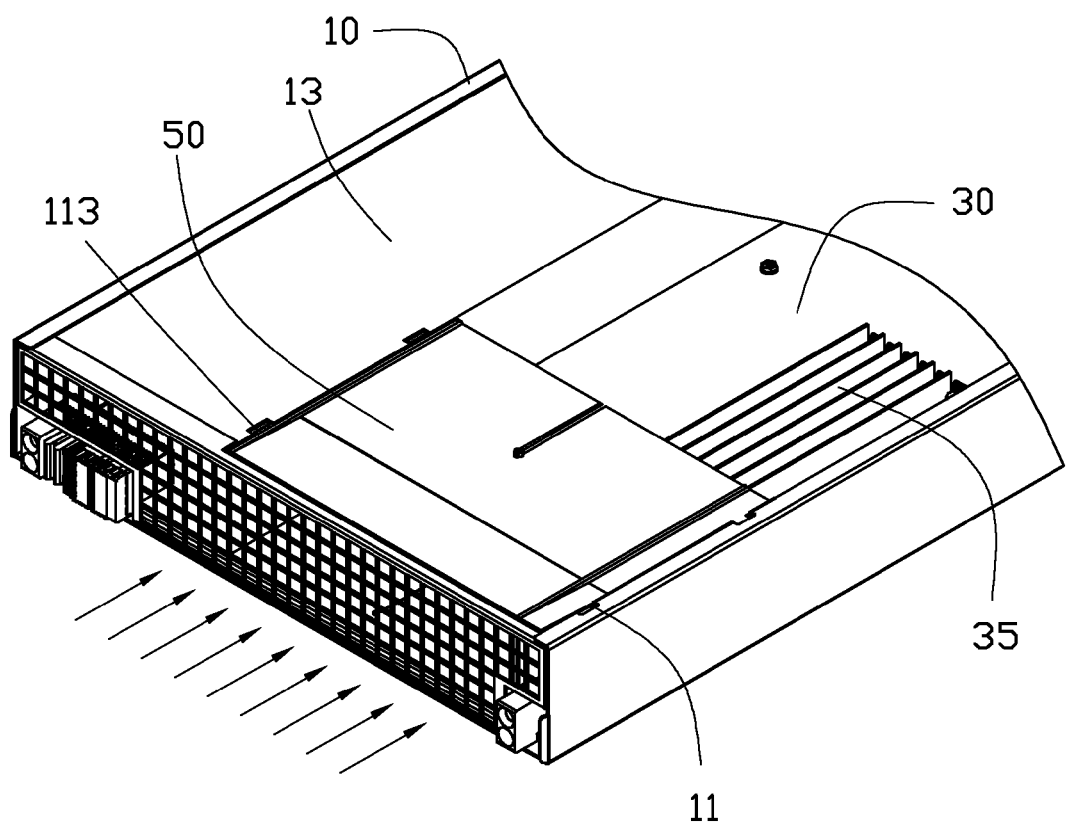
FIG. 1 is an isometric, assembled view of part of an electronic device according to an embodiment of the present disclosure.
Figure 2:
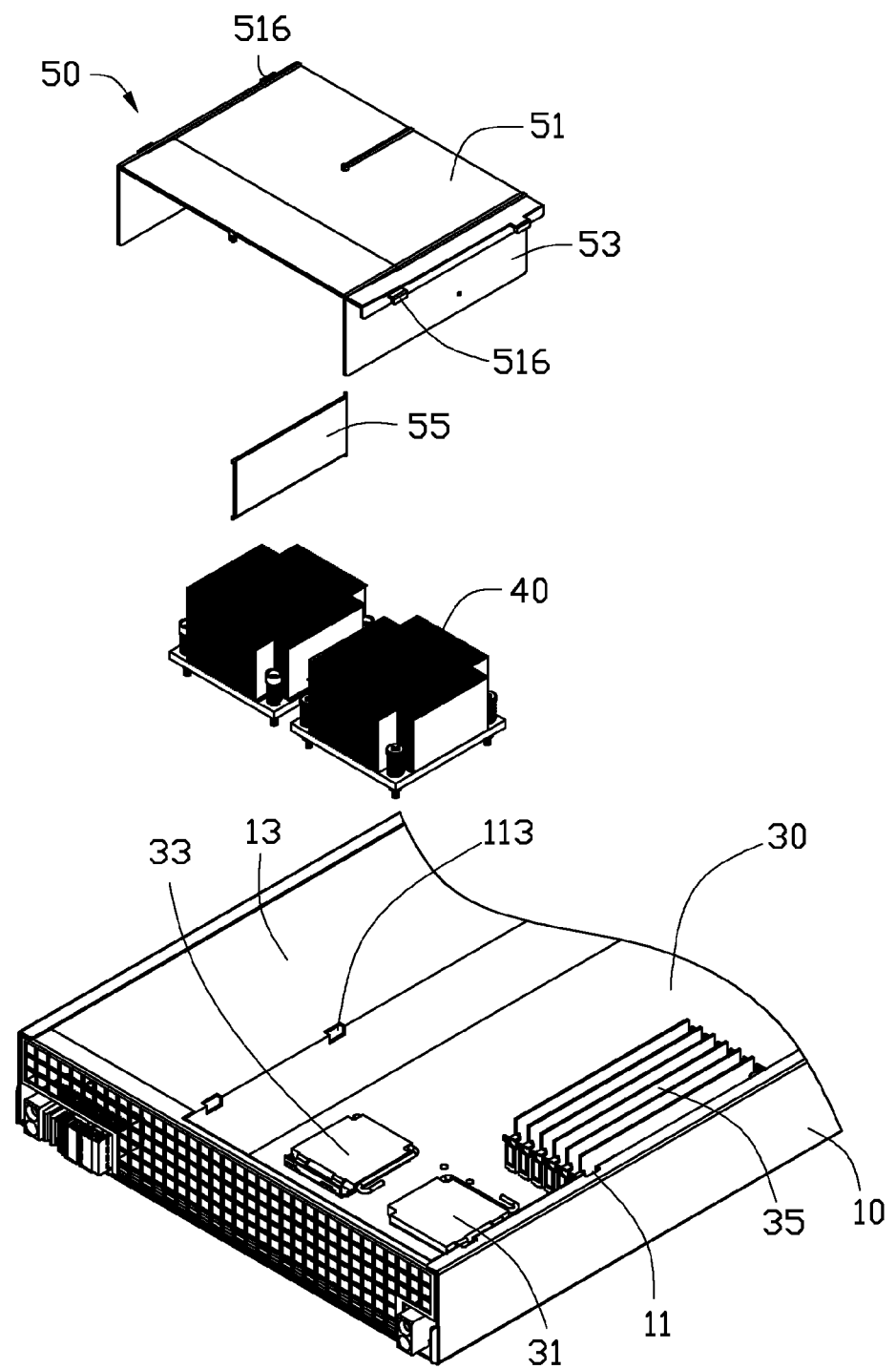
FIG. 2 is an exploded view of the electronic device of FIG. 1.

Referring to FIGS. 1-2, an electronic device is shown. The electronic device includes a casing 10, a printed circuit board (PCB) 30 enclosed by the casing 10, and a fan duct 50 mounted on the PCB 30. A first central processing unit (CPU) 31 and a second CPU 33 are mounted on a top surface of the PCB 30 and aligned with each other. Two heat sinks 40 thermally contact the first and second CPUs 31, 33, respectively, to dissipate heat generated by the first and second CPUs 31, 33. The fan duct 50 spans the first and second CPUs 31, 33 and guides airflow toward the first and second CPUs 31, 33.

In the description that follows, the stated orientations of all of the elements of the electronic device are with reference to the orientations of all of the elements as shown in FIG. 1.

Figure 3:
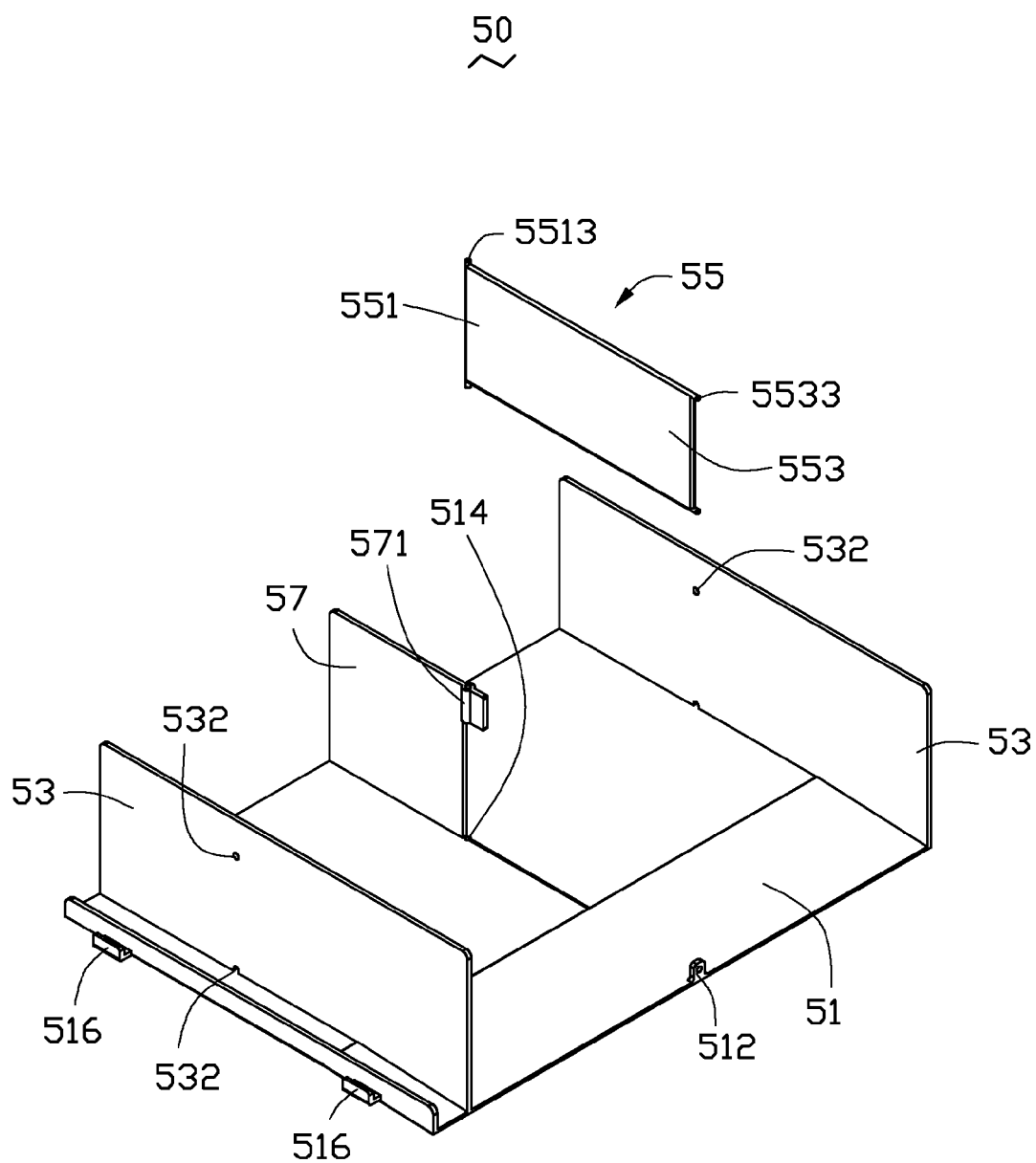
FIG. 3 is an isometric, exploded view of a fan duct of the electronic device of FIG. 2, showing the fan duct inverted.
Figure 4:
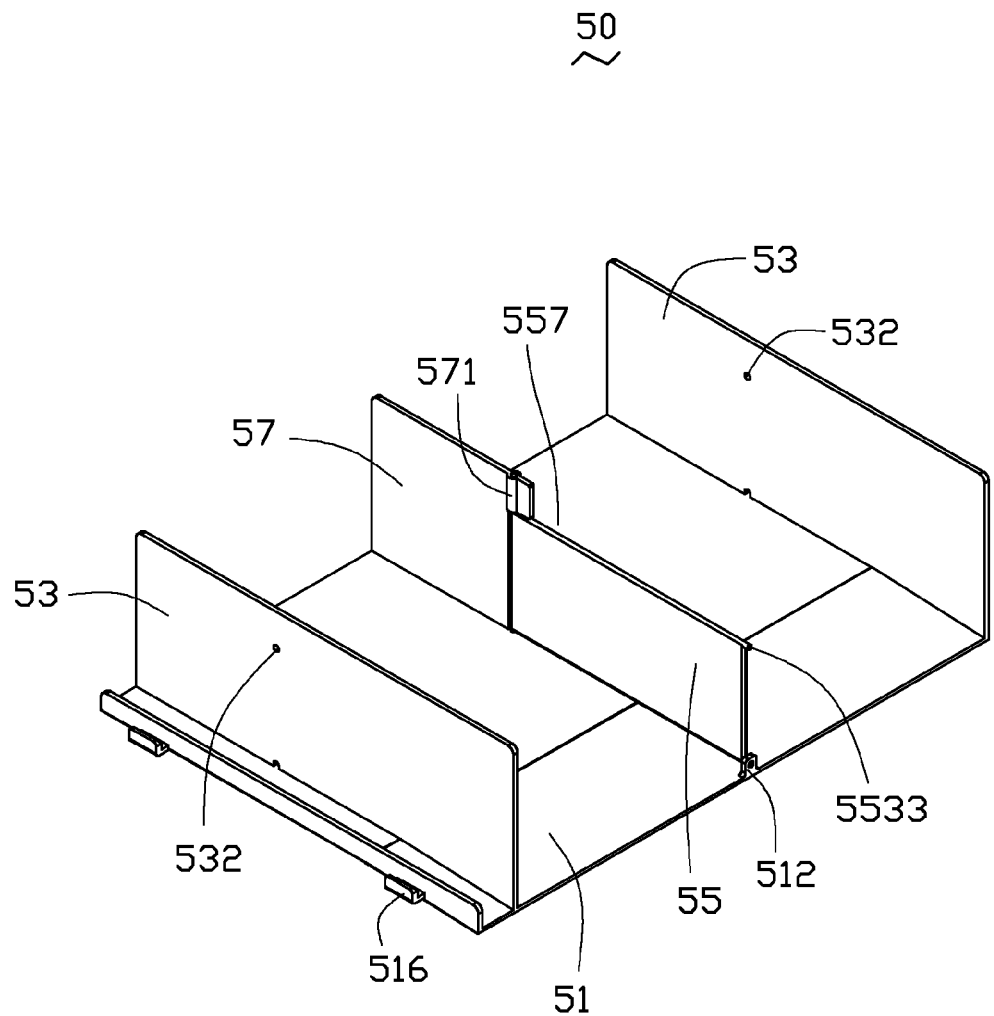
FIG. 4 is an assembled view of the fan duct of FIG. 3, wherein a baffle of the fan duct is located in a first position.

Referring also to FIGS. 3-4, the fan duct 50 includes an elongated top plate 51, two elongated sidewalls 53 extending from opposite sides of the top plate 51, an extending plate 57 in the middle of the top plate 51, and an elongated baffle 55 pivotally engaged with the top plate 51 and the extending plate 57. A tab 512 protrudes from a middle of a front side of the top plate 51 to abut the baffle 55 when the baffle 55 is aligned with the extending plate 57. An extending direction (i.e. down) of the tab 512 is the same as that of the extending plate 57. The tab 512 is aligned with the extending plate 57. The two sidewalls 53 are substantially parallel. Two spaced through holes 532 are defined in a rear portion of each sidewall 53. The two through holes 532 are aligned along a vertical direction of the sidewall 53, and are for engaging with a second end 553 of the baffle 55. The extending plate 57 is between and substantially parallel to the two sidewalls 53. A height of the extending plate 57 is equal to that of the sidewalls 53. A length of the extending plate 57 is less than that of each sidewall 53. A rear end of the extending plate 57 and rear ends of the sidewalls 53 are coplanar. A front end of the extending plate 57 is aligned with the through holes 532 of the sidewalls 53. A bottom end of the extending plate 57 and bottom ends of the sidewalls 53 are coplanar. A tube 571 is formed on a bottom side of the front end of the extending plate 57. A receiving hole 514 is defined in the top plate 51, aligned with the tube 571. The tube 571 and the receiving hole 514 provide pivotable engagement of an opposite first end 551 of the baffle 55 with the tube 571 and with the top plate 51.

The baffle 55 is made of elastic material. Two first pins 5513 protrude from opposite sides of the first end 551, along vertical directions. The two first pins 5513 are rotatably received in the receiving hole 514 of the top plate 51 and the tube 571 of the extending plate 57. Thereby, the baffle 55 is pivotably engaged with the extending plate 57 and the top plate 51. Two second pins 5533 protrude from opposite sides of the second end 553 along a horizontal direction of the baffle 55. The two second pins 5533 are engagable in the through holes 532 of either of the sidewalls 53. A top one of the second pins 5533 is engagable in the tab 512. Thus the baffle 55 can be located in different positions as desired.

Figure 5:
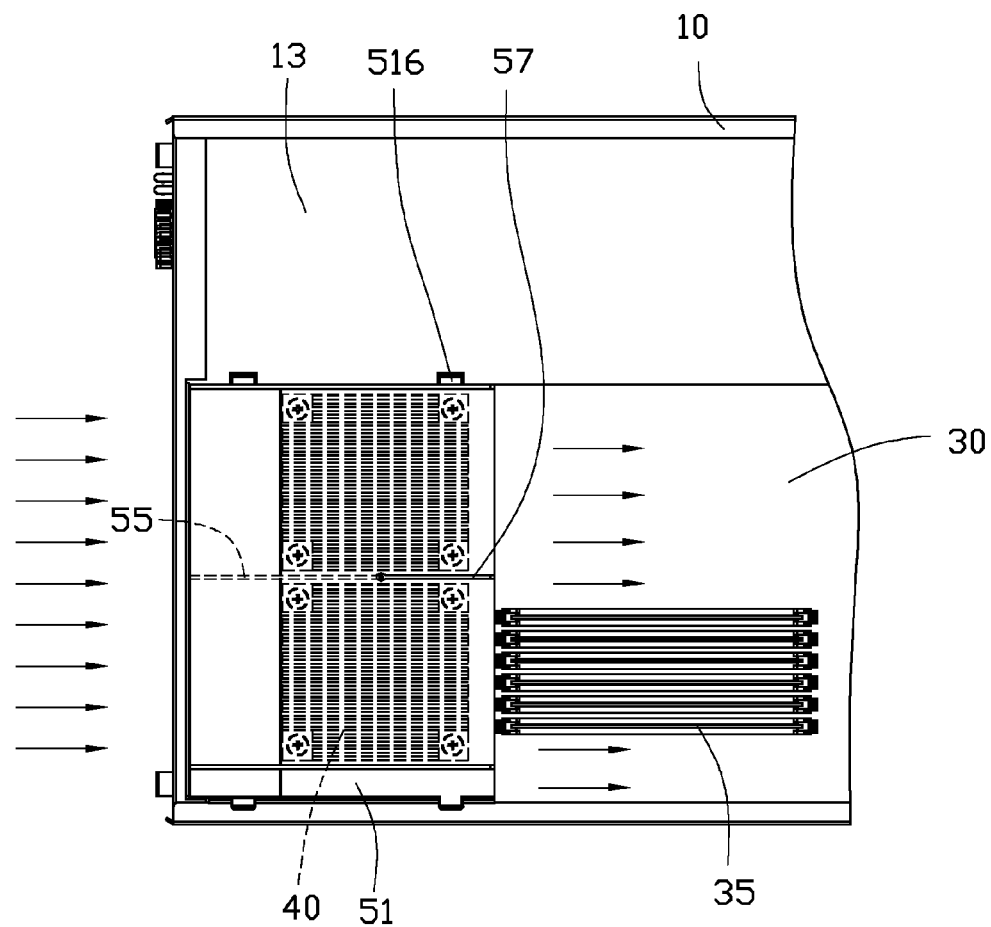
FIG. 5 is a top plan view of the electronic device of FIG. 1, but with part of a top plate of the fan duct cut away, and showing the baffle of the fan duct located in the first position.

Referring to FIGS. 4-5, when the first CPU 31 and second CPU 33 are both mounted on the PCB 30, the first and second CPUs 31, 33 are aligned with each other along a transverse direction of the PCB 30. The two sidewalls 53 of the fan duct 50 span the first and second CPUs 31, 33 to sandwich the first and second CPUs 31, 33 therebetween. The baffle 55 is rotated about the first pins 5133 until the top second pin 5533 engages with the tab 512. In this state, the baffle 55 is substantially parallel to the sidewall 53, and is defined as located at a first position. A height of the baffle 55 is less than that of the extending plate 57. A top end of the baffle 55 abuts the top plate 51. A bottom end of the baffle 55 is located above the bottom end of the extending plate 57. When the fan duct 50 is mounted on the PCB 30, the bottom ends of the sidewalls 53 and of the extending plate 57 abut the top surface of the PCB 30, and the bottom end of the baffle 55 is located above the top surface of the PCB 30. A gap 557 is defined between the top surface of the PCB 30 and the bottom end of the baffle 55. The baffle 50 is between the first and second CPUs 31, 33, and aligned along a direction of airflow. Therefore, air flowing to the fan duct 50 is not baffled by the baffle 55, and freely flows to the first and second CPUs 31, 33 and the heat sinks 40. Thus, the first and second CPUs 31, 33 are cooled and avoid overheating.

Figure 6:
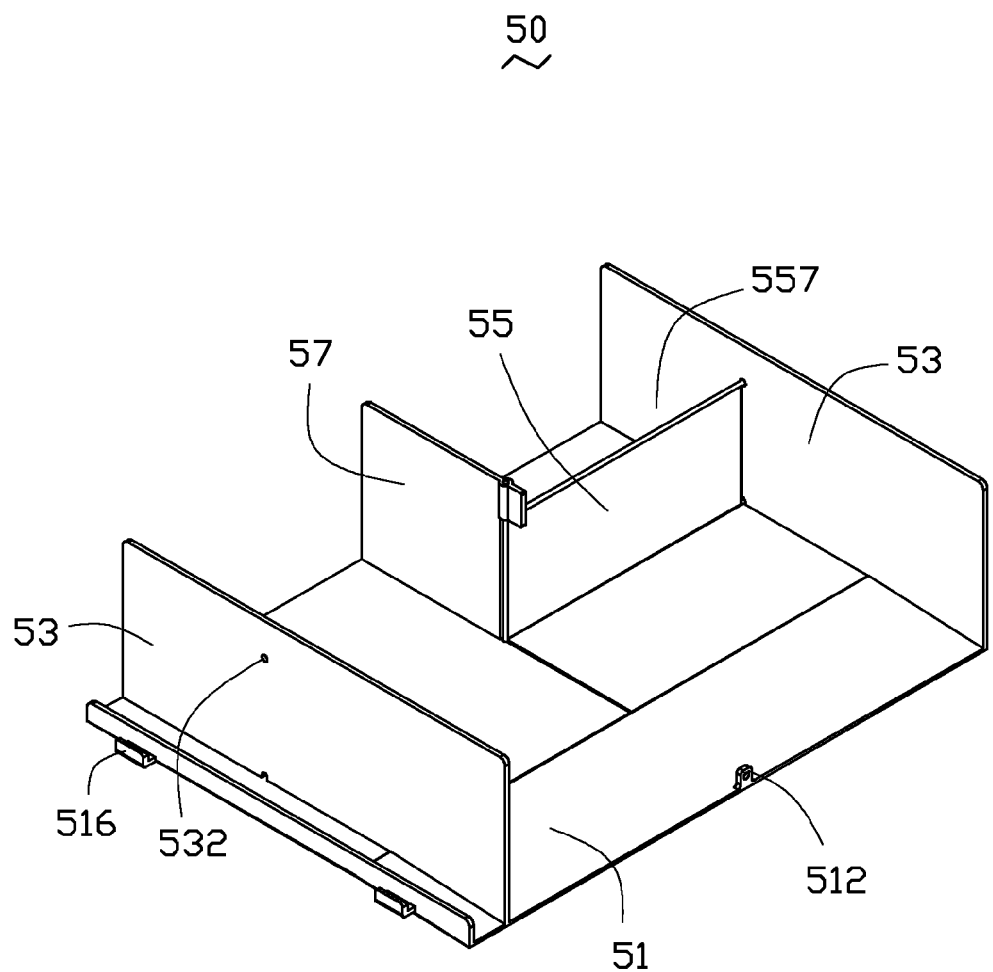
FIG. 6 is similar to FIG. 4, but showing the baffle of the fan duct located in a second position.
Figure 7:
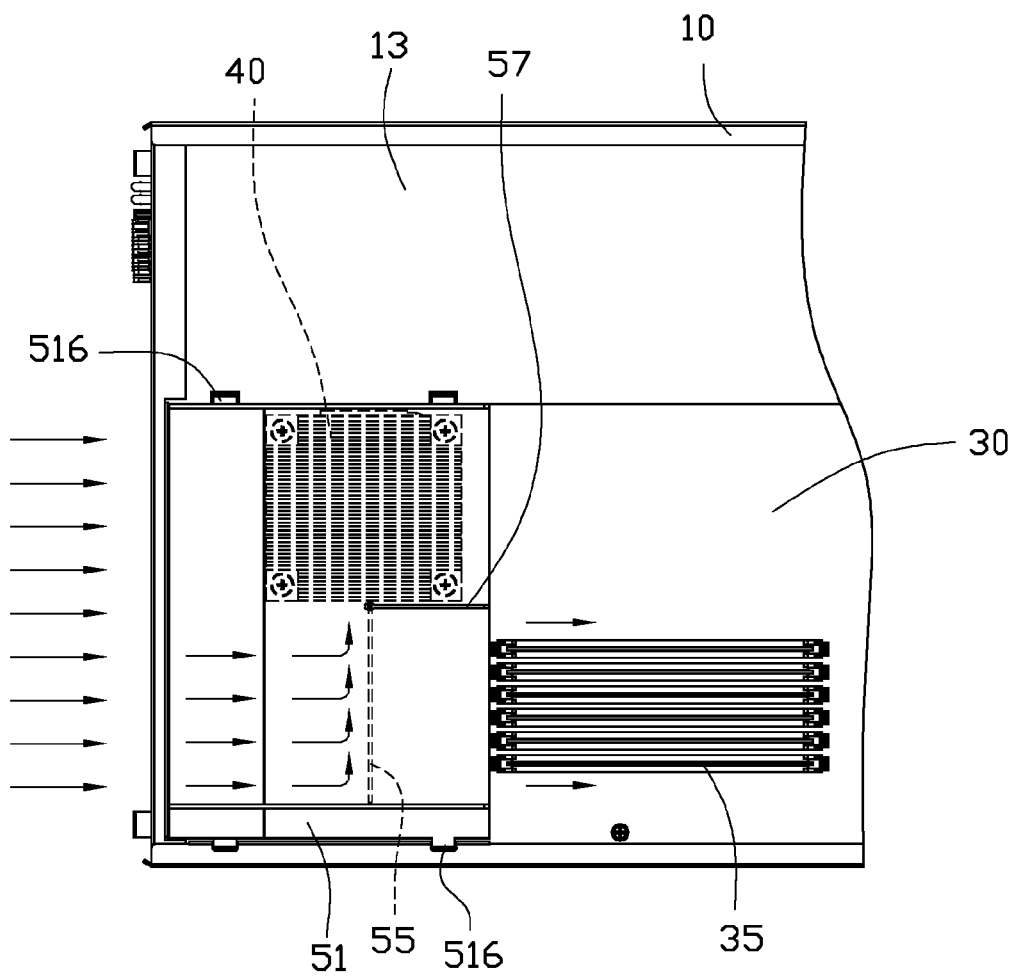
FIG. 7 is similar to FIG. 5, but showing the baffle of the fan duct located in the second position.

Referring also to FIGS. 6-7, when the first CPU 31 is removed from the PCB 30, the baffle 55 is adjusted from the first position to a second position. In this process, the baffle 55 is deformed to make the top second pin 5533 detach from the tab 512 of the top plate 51 of the fan duct 50. Then, the baffle 55 is rotated about the two first pins 5513 until it spans a portion of the fan duct 50 where the first CPU 31 was located. The baffle 55 is deformed again, and the two second pins 5533 of the second end 553 of the baffle 55 engage in the two through holes 532 of the sidewall 53 that is away from the second CPU 33. In this state, the baffle 55 is perpendicular to the extending plate 57 and located in the second position. The baffle 55 baffles most of the air that flows to the side of the fan duct 50 where the first CPU 31 was located, and directs such baffled air to flow to the heat sink 40 and the second CPU 33. Because the gap 557 is defined between the top surface of the PCB 30 and the bottom end of the baffle 55, part of the air that flows to the side of the fan duct 50 where the first CPU 31 was located flows through the gap 557 and cools other electronic components 35 located outside of the fan duct 50 downstream from where the first CPU 31 was located. Alternatively, the second CPU 33 can be removed, and the baffle 55 can be engaged with the other sidewall 53.

Referring to FIGS. 1-2 again, the fan duct 50 further includes two pairs of clasps 516. The two pairs of clasps 516 are formed on opposite lateral ends of the top plate 51, respectively, and are located outside of the two sidewalls 53. Each clasp 516 has an L-shaped configuration. One pair of clasps 516 clasps two securing holes 11 of the casing 10, and the other pair of clasps 516 clasps two securing holes 131 of a connector 13 in the casing 10. Thereby, the fan duct 50 is secured on the casing 10.

It is to be understood, however, that even though numerous characteristics and advantages of the embodiment(s) have been set forth in the foregoing description, together with details of the structures and functions of the embodiment(s), the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fan duct comprising:
a top plate;
two sidewalls depending from opposite sides of the top plate; and
a baffle between the two sidewalls, the baffle pivotally engaged with the top plate;
wherein the baffle comprises a first end and a second end opposite to the first end, the first end is pivotally engaged with the top plate, and the baffle is rotatable about the first end to make the second end selectively engage with the top plate or either one of the sidewalls;
an extending plate extends from the top plate and is located between the two sidewalls, and opposite sides of the first end of the baffle pivotally engage with the top plate and the extending plate, respectively; and
a tube protrudes from the extending plate, two first pins are formed on opposite ends of the first end of the baffle, one of the first pins extends through the top plate and the other first pin is received in the tube, and the baffle rotates about the two first pins.

2. The fan duct of claim 1, wherein a second pin protrudes from the second end of the baffle to abut the top plate or one of the sidewalls.

3. The fan duct of claim 2, wherein a receiving hole is defined in the top plate to receive the first pin therein, a tab is formed on the top plate to abut the second pin, and a through hole is defined in the sidewall to receive the second pin therein.

4. The fan duct of claim 1, wherein the baffle is made of elastic material.

5. The fan duct of claim 1, wherein each of the baffle and the sidewalls is elongated, a top end of the baffle abuts the top plate, and a bottom end of the baffle is above bottom ends of the sidewalls.

6. An electronic device comprising:
a casing;
a printed circuit board (PCB) enclosed by the casing; and
a fan duct mounted on the PCB, the fan duct comprising:
a top plate;
two sidewalls depending from opposite sides of the top plate; and
a baffle located between the two sidewalls, the baffle comprising a first end and a second end opposite to the first end, the first end pivotally engaging with the top plate;
wherein when two electronic components are mounted on the PCB and are located in line between the sidewalls of the fan duct, the second end of the baffle is engaged with the top plate to position the baffle between the two electronic components with the baffle being aligned along a direction of airflow, such that air flowing through the fan duct is not baffled by the baffle and passes over the two electronic components; and
when only one of the two electronic components is mounted on the PCB, the second end of the baffle is engaged with the sidewall away from the electronic component, such that the baffle baffles air flowing through the fan duct at the location of the missing electronic component and directs at least part of such air to flow toward the electronic component mounted on the PCB.

7. The electronic device of claim 6, wherein bottom ends of the sidewalls abut a top surface of the PCB, and a bottom end of the baffle is located above the top surface of the PCB to define a gap between the bottom end of the baffle and the top surface of the PCB.

8. The electronic device of claim 6, wherein a tab protrudes from the top plate to abut the second end of the baffle.

9. The electronic device of claim 8, wherein a first pin protrudes from the first end of the baffle and pivotally engages with the top plate, and a second pin protrudes from the second end of the baffle to abut the tab or the sidewall away from the electronic component.

10. The electronic device of claim 9, wherein a receiving hole is defined in the top plate to receive the first pin therein, and a through hole is defined in each of the sidewalls to receive the second pin therein.

11. The electronic device of claim 9, wherein an extending plate extends from the top plate and is located between the two sidewalls, and opposite sides of the first end of the baffle pivotally engage with the top plate and the extending plate, respectively.

12. The electronic device of claim 11, wherein a tube protrudes from the extending plate, the first end of the baffle further comprises another first pin protruding therefrom, the two first pins are formed on the opposite sides of the first end of the baffle, one of the first pins extends through the top plate and the other first pin is received in the tube, and the baffle rotates about the two first pins.

13. The electronic device of claim 12, wherein the extending plate is aligned with the baffle when the second end of the baffle abuts the tab, and the extending plate is perpendicular to the baffle when the second end of the baffle abuts the sidewall away from the electronic component.

14. The electronic device of claim 13, wherein a bottom end of the extending plate and bottom ends of the sidewalls are coplanar and abut the PCB, and a bottom end of the baffle is located above the PCB.

15. The electronic device of claim 6, wherein two clasps are formed on the opposite ends of the top plate and clasp the casing.

16. The electronic device of claim 6, wherein the baffle is made of elastic material.

17. A fan duct comprising:
a top plate;
first and second sidewalls depending from opposite sides of the top plate;
a flexible baffle between the two sidewalls, the baffle pivotably engaged with the top plate; and
an extending plate extending from the top plate and located between the first sidewall and the second sidewall;
wherein the baffle comprises opposite first and second ends, the first end is pivotably engaged with the top plate, and the baffle is pivotable about the first end to cause the second end to be selectably engaged with any one of the top plate, the first sidewall, and the second sidewall;
an air channel is defined between the first sidewall and the extending plate, another air channel is defined between the second sidewall and the extending plate, and the two air channels are located side by side and aligned with each other along a transverse direction of the top plate;
when the second end of the baffle engages with the top plate, the baffle is aligned with the extending plate along a longitudinal direction of the top plate to allow air to flow through the two air channels of the fan duct and not be baffled by the baffle; and
when the second end of the baffle engages with the first sidewall or the second sidewall, the baffle is angled with respect to the extending plate to baffle air flowing in one of the air channels and direct at least some of the baffled airflow toward the other air channel.

18. The fan duct of claim 17, wherein the first sidewall is parallel to the second sidewall and the extending plate.

19. The fan duct of claim 18, wherein when the second end of the baffle engages with the first sidewall or the second sidewall, the baffle is perpendicular to the extending plate.

20. The fan duct of claim 18, wherein each of the baffle, the first sidewall and the second sidewall is elongated, a top end of the baffle abuts the top plate, and a bottom end of the baffle is above bottom ends of the first sidewall and the second sidewall.

* * * * *